United States Patent
Kim

(10) Patent No.: US 12,094,885 B2
(45) Date of Patent: Sep. 17, 2024

(54) DISPLAY DEVICE HAVING A FLEXIBLE PRINTED CIRCUIT BOARD CONNECTED TO A PAD PORTION

(71) Applicant: Samsung Display Co., Ltd., Yongin-si (KR)

(72) Inventor: Min Soo Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 341 days.

(21) Appl. No.: 17/209,063

(22) Filed: Mar. 22, 2021

(65) Prior Publication Data

US 2021/0210069 A1 Jul. 8, 2021
US 2023/0154452 A9 May 18, 2023

Related U.S. Application Data

(62) Division of application No. 16/446,983, filed on Jun. 20, 2019, now Pat. No. 10,964,725.

(30) Foreign Application Priority Data

Jul. 10, 2018 (KR) .......................... 10-2018-0079698

(51) Int. Cl.
*G10L 13/04* (2013.01)
*G06F 3/041* (2006.01)
(Continued)

(52) U.S. Cl.
CPC .......... *H01L 27/124* (2013.01); *G06F 3/0412* (2013.01); *G06F 3/0446* (2019.05);
(Continued)

(58) Field of Classification Search
CPC ......... G10L 13/04; G10L 19/00; G10L 13/08; G06F 18/2135; G06F 18/10;
(Continued)

(56) References Cited

U.S. PATENT DOCUMENTS

| 4,909,017 A | 3/1990 | McMahon et al. |
| D806,705 S | 1/2018 | Akana et al. |

(Continued)

FOREIGN PATENT DOCUMENTS

| CN | 106935620 | 7/2017 |
| CN | 108258016 | 7/2018 |

(Continued)

OTHER PUBLICATIONS

NonFinal Office Action mailed Jun. 18, 2020, in U.S. Appl. No. 16/446,983.
Notice of Allowance mailed Nov. 19, 2020, in U.S. Appl. No. 16/446,983.
(Continued)

*Primary Examiner* — Wing H Chow
(74) *Attorney, Agent, or Firm* — KILE PARK REED & HOUTTEMAN PLLC

(57) ABSTRACT

A display device includes: a display panel having a first side and a second side facing the first side in a first direction, the display panel including a recessed portion having a recessed shape from the first side of the display panel toward the second side in the first direction, the recessed portion including a side extended from the first side of the display panel; a pad portion disposed on a front surface of the display panel, the pad portion being adjacent to at least one side of the recessed portion; and a flexible printed circuit (FPC) connected to the pad portion, the FPC being bent to a rear surface of the display panel around the at least one side of the recessed portion, the rear surface opposing the front surface.

9 Claims, 16 Drawing Sheets

(51) Int. Cl.

| | | |
|---|---|---|
| *G06F 3/044* | (2006.01) | |
| *G06F 18/10* | (2023.01) | |
| *G06F 18/21* | (2023.01) | |
| *G06F 18/2135* | (2023.01) | |
| *G06N 3/02* | (2006.01) | |
| *G06N 3/04* | (2023.01) | |
| *G06N 3/042* | (2023.01) | |
| *G06N 3/08* | (2023.01) | |
| *G06N 5/02* | (2023.01) | |
| *G10L 13/08* | (2013.01) | |
| *G10L 19/00* | (2013.01) | |
| *H01L 27/12* | (2006.01) | |
| *H05K 1/02* | (2006.01) | |
| *H05K 1/14* | (2006.01) | |
| *G02F 1/1345* | (2006.01) | |
| *H10K 59/131* | (2023.01) | |
| *H10K 77/10* | (2023.01) | |

(52) U.S. Cl.
CPC .......... *G06F 18/10* (2023.01); *G06F 18/2135* (2023.01); *G06F 18/217* (2023.01); *G06N 3/02* (2013.01); *G06N 3/042* (2023.01); *G06N 3/08* (2013.01); *G06N 5/02* (2013.01); *G10L 13/04* (2013.01); *G10L 13/08* (2013.01); *G10L 19/00* (2013.01); *H01L 27/1218* (2013.01); *H05K 1/028* (2013.01); *H05K 1/147* (2013.01); *G02F 1/13452* (2013.01); *G02F 2201/56* (2013.01); *G06F 2203/04102* (2013.01); *H05K 2201/056* (2013.01); *H05K 2201/10128* (2013.01); *H05K 2201/10136* (2013.01); *H10K 59/131* (2023.02); *H10K 77/10* (2023.02)

(58) Field of Classification Search
CPC .......... G06F 18/217; G06N 5/02; G06N 3/02; G06N 3/042; G06N 3/08
See application file for complete search history.

(56) References Cited

U.S. PATENT DOCUMENTS

| | | | |
|---|---|---|---|
| 10,249,835 | B2 | 4/2019 | Cho et al. |
| 10,340,317 | B2 | 7/2019 | Oh et al. |
| 10,411,084 | B2 | 9/2019 | Yeo |
| 10,607,573 | B2 | 3/2020 | Silvanto et al. |
| 2008/0117367 | A1 | 5/2008 | Abe |
| 2014/0354900 | A1* | 12/2014 | Qian ...................... H05K 1/028 |
| | | | 174/254 |
| 2015/0070840 | A1* | 3/2015 | Rappoport ............ G06F 1/1633 |
| | | | 174/254 |
| 2015/0130726 | A1 | 5/2015 | Min et al. |
| 2017/0048990 | A1* | 2/2017 | Sim ...................... G06F 1/1656 |
| 2019/0043452 | A1 | 2/2019 | Silvanto et al. |

FOREIGN PATENT DOCUMENTS

| | | |
|---|---|---|
| JP | 2008-129046 | 6/2008 |
| KR | 10-2015-0053540 | 5/2015 |
| KR | 10-2018-0025308 | 3/2018 |
| KR | 10-2018-0042351 | 4/2018 |
| WO | 2017/058416 | 4/2017 |

OTHER PUBLICATIONS

Corrected Notice of Allowability mailed Feb. 9, 2021, in U.S. Appl. No. 16/446,983.
Chinese Office Action with English translation for Chinese Patent Application No. 201910613682.6, dated Jun. 18, 2024.

\* cited by examiner

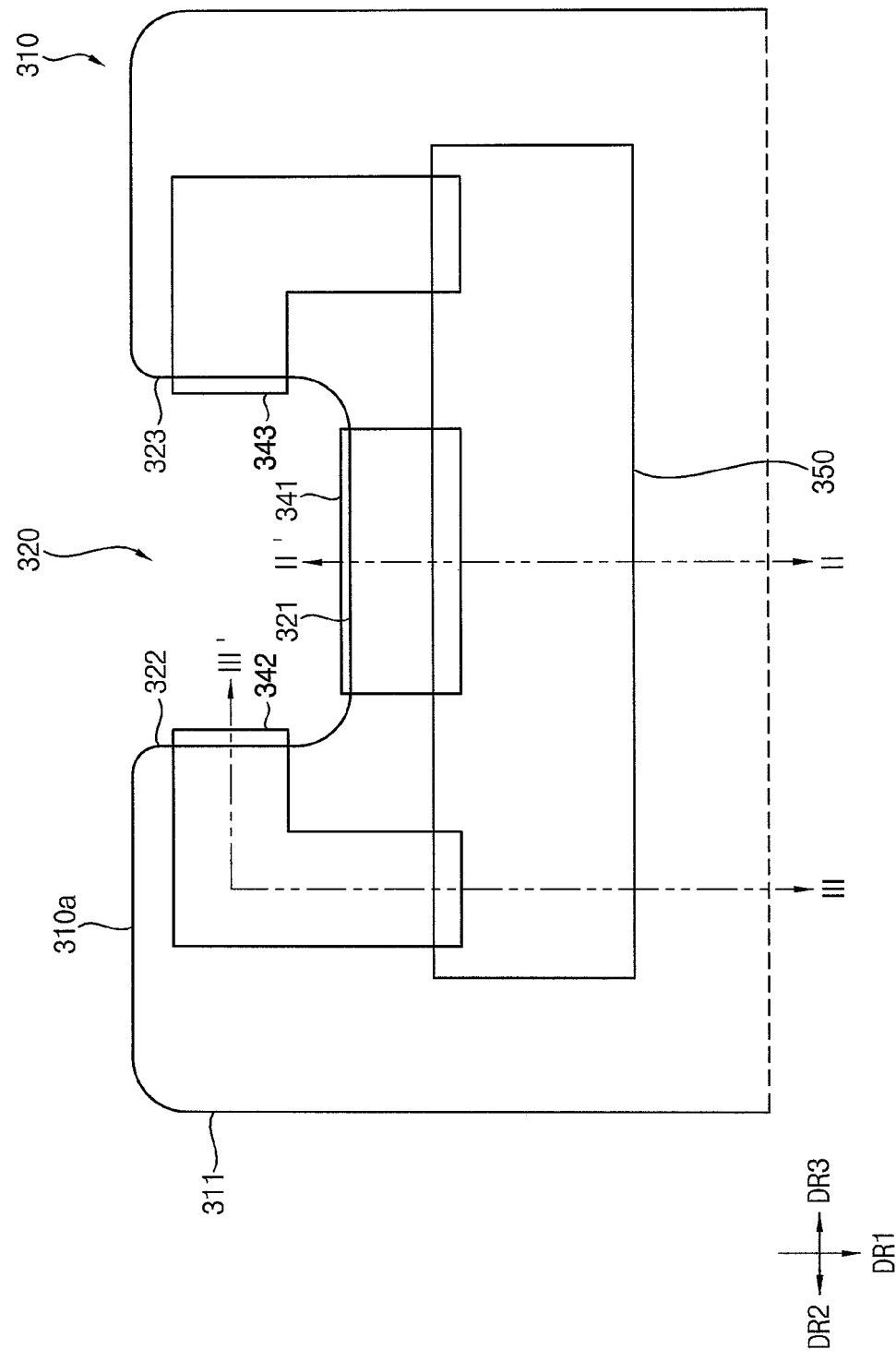

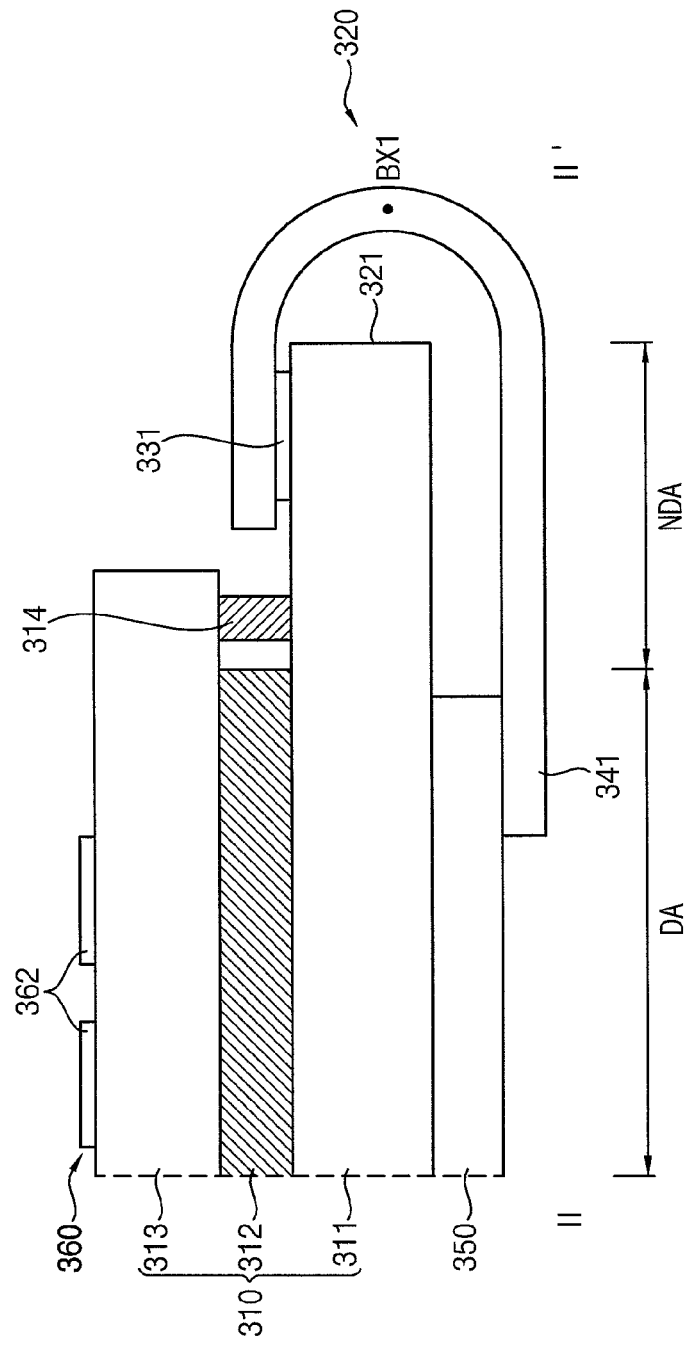

DISPLAY DEVICE HAVING A FLEXIBLE PRINTED CIRCUIT BOARD CONNECTED TO A PAD PORTION

CROSS-REFERENCE TO RELATED APPLICATION

This application claims priority from and the benefit of Korean Patent Application No. 10-2018-0079698, filed on Jul. 10, 2018, which is hereby incorporated by reference for all purposes as if fully set forth herein.

BACKGROUND

Field

Exemplary implementations of the invention relate generally to an electronic device and, more specifically, to a display device including a display panel and a flexible printed circuit.

Discussion of the Background

A display device such as an organic light emitting display (OLED), a liquid crystal display (LCD), etc. may include a display panel including pixels for displaying an image. A pad portion for input and output of signals may be disposed on the display panel to control driving of the display panel. A connecting member such as an integrated circuit (IC) chip, a flexible printed circuit (FPC), etc. may be attached to the pad portion.

The above information disclosed in this Background section is only for understanding of the background of the inventive concepts, and, therefore, it may contain information that does not constitute prior art.

SUMMARY

Devices constructed according to exemplary implementations of the invention are capable of providing a display device having a reduced dead space.

According to one or more embodiments of the invention, a display device includes: a display panel having a first side and a second side facing the first side in a first direction, the display panel including a recessed portion having a recessed shape from the first side of the display panel toward the second side in the first direction, the recessed portion including at least one side; a pad portion disposed on a front surface of the display panel, the pad portion being adjacent to the at least one side of the recessed portion; and a flexible printed circuit (FPC) connected to the pad portion, the FPC being bent to a rear surface of the display panel around the at least one side of the recessed portion, the rear surface opposing the front surface.

The display device may further include a printed circuit board (PCB) on the rear surface of the display panel, the PCB being connected to the FPC.

The at least one side of the recessed portion may include a first side, a second side and a third side, the first side being parallel with the first side of the display panel, and the second side and the third side connecting the first side of the recessed portion to the first side of the display panel respectively and facing each other. The pad portion may be disposed adjacent to the first side of the recessed portion.

The display panel may include a non-display area adjacent to the first side of the display panel and the first, second, and third sides of the recessed portion; and a display area adjacent to the first side of the display panel and the first, second, and third sides of the recessed portion with the non-display area in between. A distance from the second side of the display panel to an end of the pad portion adjacent to the first side of the recessed portion may be smaller than a distance from the second side of the display panel to an end of the display area adjacent to the first side of the display panel.

The display device may further include a plurality of data lines disposed in the display area extending along the first direction; and a plurality of fan-out lines disposed in the non-display area extending along the non-display area, the plurality of fan-out lines is respectively connected to the plurality of data lines.

A width of the pad portion may be less than a width of the recessed portion corresponding to a distance between the second side and the third side of the recessed portion.

The FPC may be bent along a bending axis. A distance from the second side of the display panel to the bending axis of the FPC may be smaller than a distance from the second side of the display panel to the first side of the display panel.

A distance from the second side of the display panel to the bending axis of the FPC may be greater than a distance from the second side of the display panel to the first side of the recessed portion.

A width of the FPC may be less than a width of the recessed portion corresponding to a distance between the second side and the third side of the recessed portion.

The display device may further include at least one of a camera module, a sensor module, and a speaker module disposed in the recessed portion.

According to one or more embodiments of the invention, a display includes a display panel having a first side and a second side facing the first side in a first direction, the display panel comprising a recessed portion having a recessed shape from the first side of the display panel toward the second side in the first direction, the recessed portion including a first side parallel with the first side of the display panel, and a second side and a third side connecting the first side of the recessed portion to the first side of the display panel and opposite to each other; a first pad portion on a front surface of the display panel, the first pad portion being adjacent to the first side of the recessed portion; a first flexible printed circuit (FPC) connected to the first pad portion, the first FPC being bent to a rear surface of the display panel around the first side of the recessed portion; a second pad portion on the front surface of the display panel, the second pad portion being adjacent to the second side of the recessed portion; a second FPC connected to the second pad portion, the second FPC being bent to the rear surface of the display panel around the second side of the recessed portion; a third pad portion on the front surface of the display panel, the third pad portion being adjacent to the third side of the recessed portion; and a third FPC connected to the third pad portion, the third FPC being bent to the rear surface of the display panel around the third side of the recessed portion.

The display device may further include a printed circuit board (PCB) on the rear surface of the display panel, the PCB being connected to the first FPC, the second FPC, and the third FPC.

The display panel may include a non-display area adjacent to the first side of the display panel and the first, second, and third sides of the recessed portion; and a display area adjacent to the first side of the display panel and the first, second, and third sides of the recessed portion with the non-display area in between. The display device may further include a plurality of data lines disposed in the display area extended along the first direction. The plurality of data lines may include a first data line located at the first direction from the recessed portion in the display area, a second data line located at a second direction crossing the first direction from the recessed portion in the display area, and a third data line located at a third direction opposite to the second direction from the recessed portion in the display area.

The display device may further include a plurality of fan-out lines disposed in the non-display area, the plurality of fan-out lines respectively connected to the plurality of data lines. The plurality of fan-out lines may include a first fan-out line connecting the first pad portion to the first data line, a second fan-out line connecting the second pad portion to the second data line, and a third fan-out line connecting the third pad portion to the third data line.

The display device may further include a touch sensing unit disposed on the front surface of the display panel, the touch sensing unit being connected to the second pad portion and the third pad portion.

The display panel may include a first substrate, a display unit disposed on the first substrate, and a second substrate on the display unit. The touch sensing unit may be disposed on a front surface of the second substrate.

The first pad portion may be disposed on a front surface of the first substrate. The second pad portion and the third pad portion may be disposed on the front surface of the second substrate.

The display panel may include a flexible substrate, a display unit on the flexible substrate, and an encapsulation layer covering the display unit. The touch sensing unit may be disposed on a front surface of the encapsulation layer.

The first pad portion, the second pad portion, and the third pad portion may be disposed on a front surface of the flexible substrate.

The touch sensing unit may include a plurality of first sensing electrodes extended along the first direction and a plurality of second sensing electrodes extended along a second direction crossing the first direction. The second pad portion may be connected to the plurality of first sensing electrodes. The third pad portion may be connected to the plurality of second sensing electrodes.

The display device according to the exemplary embodiments may include the recessed portion formed at the first side of the display panel, the pad portion located on the front surface of the display panel adjacent to the side of the recessed portion, and the FPC connected to the pad portion and bent to the rear surface of the display panel around the side of the recessed portion. Accordingly, the display device according to the exemplary embodiment may have reduced dead space of the display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 9 is a rear view illustrating the display device in FIG. 7.

FIG. 10A is a cross-sectional view illustrating the display device in FIG. 9 taken along a sectional line II-II'.

DETAILED DESCRIPTION

Figure 1:
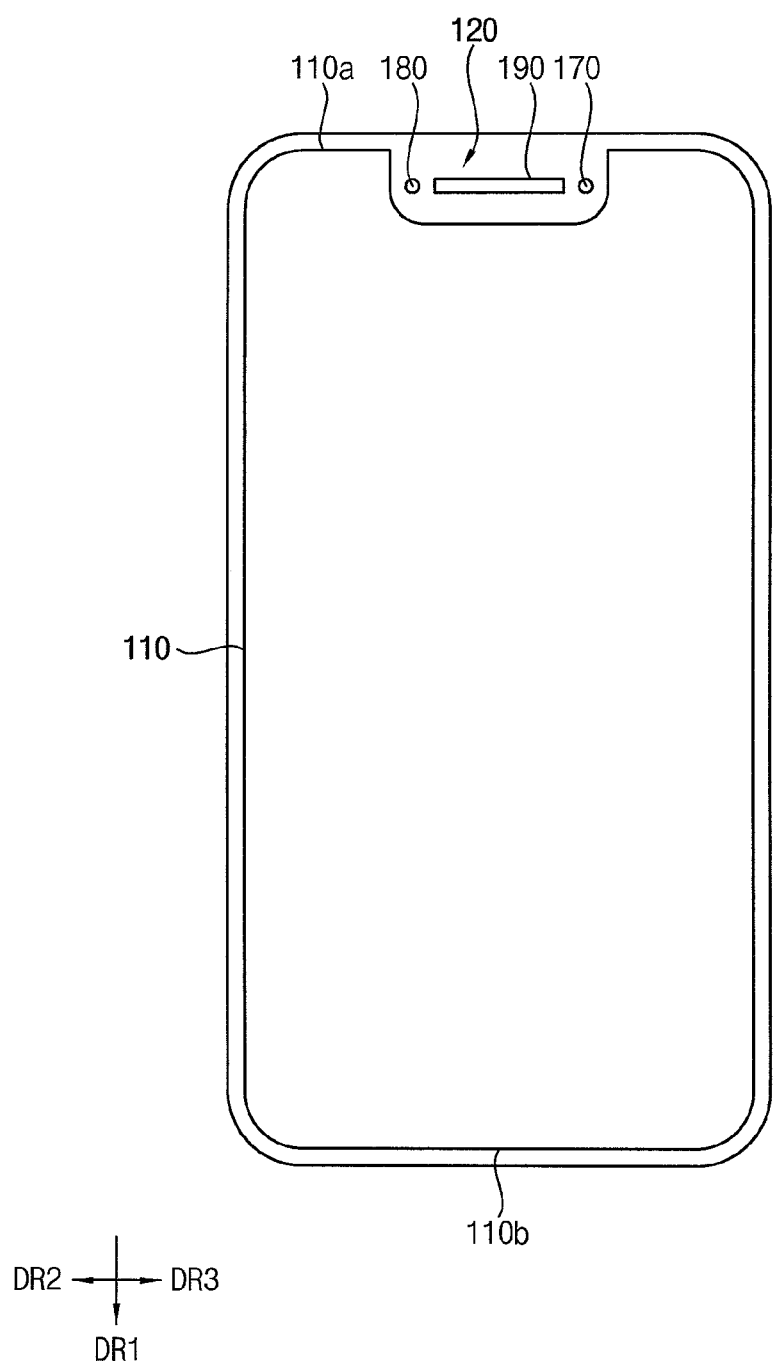
FIG. 1 is a plan view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, DR1 direction, DR2 direction, and DR3 direction are not limited to a rectangular coordinate system, such as the x, y, and z—axes, and may be interpreted in a broader sense. For example, the DR1 direction, the DR2 direction, and the DR3 direction may be may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an exemplary embodiment will be described with reference to FIGS. 1, 2, 3, and 4.

Figure 2:
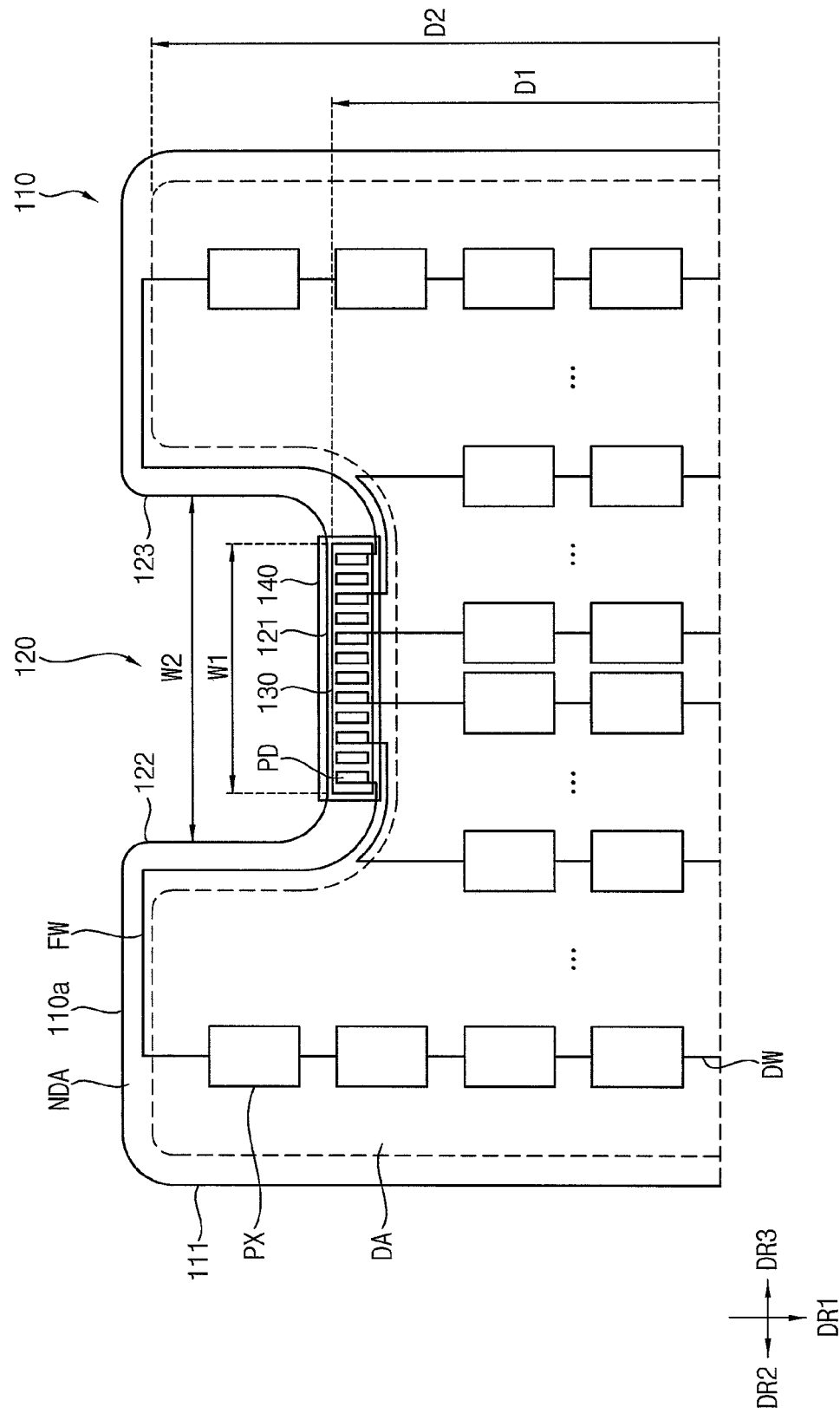
FIG. 2 is a front view illustrating a display device according to an exemplary embodiment.
Figure 3:
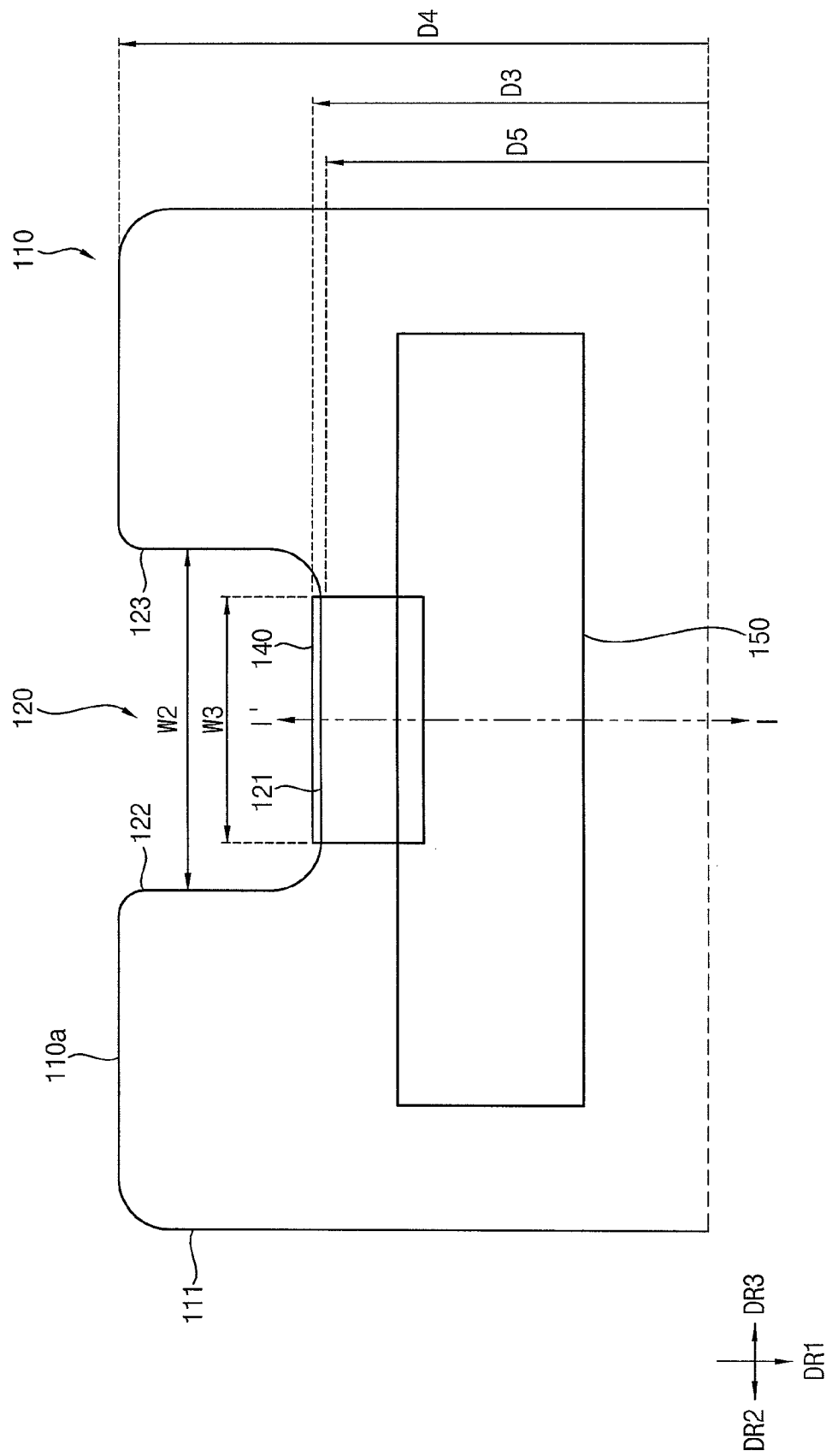
FIG. 3 is a rear view illustrating the display device in FIG. 2.
Figure 4:
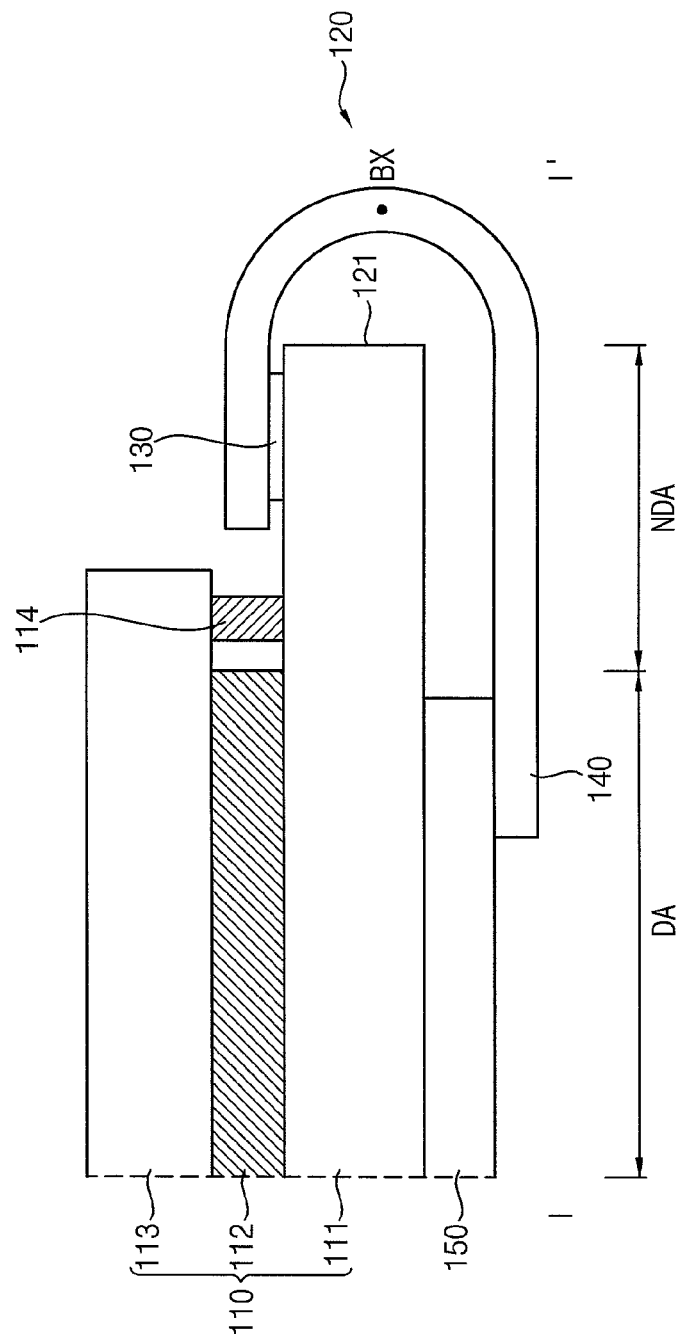
FIG. 4 is a cross-sectional view illustrating the display device in FIG. 3 taken along a sectional line I-I'.

FIG. 1 is a plan view illustrating a display device according to an exemplary embodiment. FIG. 2 is a front view illustrating a display device according to an exemplary embodiment. FIG. 3 is a rear view illustrating the display device in FIG. 2. FIG. 4 is a cross-sectional view illustrating the display device in FIG. 3 taken along a sectional line I-I'.

Referring to FIGS. 1, 2, 3, and 4, a display device according to an exemplary embodiment may include a display panel 110, a pad portion 130, a flexible printed circuit (FPC) 140, and a printed circuit board (PCB) 150. A recessed portion 120 may be formed at one side of the display panel 110.

The display panel 110 may display an image. The display panel 110 may be any one of an organic light emitting display panel and a liquid crystal display panel.

The display panel 110 may have a substantially quadrangular shape in a plan view. However, a planar shape of the display panel 110 is not limited thereto, and the display panel 110 may have a circular shape, a polygonal shape, etc. the display panel 110 may have a first side 110a and a second side 110b. The second side 110b may be opposite to the first side 110a, and may be located in a first direction DR1 from the first side 110a. Here, the first side 110a and the second side 110b may be an upper side and a lower side of the display panel 110, respectively.

The recessed portion 120 having a recessed shape toward the first direction DR1 from the first side 110a may be formed at the first side 110a of the display panel 110. The recessed portion 120 may include a side extended from the first side 110a of the display panel 110. In an exemplary embodiment, the recessed portion 120 may include a first side 121 parallel with the first side 110a of the display panel 110, and a second side 122 and a third side 123 connecting the first side 121 to the first side 110a of the display panel 110. The second side 122 may be extended from an end of the first side 121, and the third side 123 may be extended from another end of the first side 121. The second side 122 and the third side 123 may be opposite to each other.

Some elements included in the display device may be disposed in the recessed portion 120. In an exemplary embodiment, at least one of a camera module 170, a sensor module 180, and a speaker module 190 may be disposed in the recessed portion 120. In this case, the camera module 170, the sensor module 180, and the speaker module 190 may not overlap the FPC 140 in a plan view, which will be described below.

The display panel 110 may include a display area DA displaying an image and a non-display area NDA adjacent to the display area DA. The non-display area NDA may be located between the display area DA and sides of the display panel 110. For example, the display area DA may be located adjacent to the first side 121, the second side 122, and the third side 123 of the recessed portion 120 with the non-display area NDA in between, and the non-display area NDA may be located between the display area DA and the first side 110a of the display panel 110 and between the display area DA and the first side 121, the second side 122, and the third side 123 of the recessed portion 120.

A plurality of pixels PX may be disposed in the display area DA of the display panel 110. The plurality of pixels PX may be arranged in the display area DA as a substantial matrix form. The display panel 110 may display an image that is a combination of light emitted from each of the plurality of pixels PX.

A plurality of data lines DW may be disposed in the display area DA. The data lines DW may extend along the first direction DR1, and may be spaced apart from each other in a second direction DR2 crossing the first direction DR1. The data lines DW may supply data voltage for emitting light to the plurality of pixels PX.

The display panel 110 may include a first substrate 111, a display unit 112, and a second substrate 113. For example, the first substrate 111 may be a transparent insulating substrate including glass or plastic.

The display unit 112 may be disposed on the first substrate 111. The display unit 112 may include the plurality of pixels PX, and may be located in the display area DA. For example, when the display panel 110 is an organic light emitting display panel, each of the plurality of pixels PX included in the display unit 112 may include at least one thin film transistor, an anode electrode connected thereto, a cathode electrode opposite to the anode electrode, and an organic light emitting layer between the anode electrode and the cathode electrode. Further, when the display panel 110 is a liquid crystal display panel, each of the plurality of pixels PX included in the display unit 112 may include at least one thin film transistor, a pixel electrode connected thereto, a common electrode opposite to the pixel electrode, a liquid crystal layer between the pixel electrode and the common electrode, and a color filter.

The second substrate 113 may be disposed on the display unit 112. The second substrate 113 may be opposite to the first substrate 111 with the display unit 112 in between. For example, the second substrate 113 may be a transparent insulating substrate including glass or plastic.

A sealing unit 114 may be disposed between the first substrate 111 and the second substrate 113 to attach the second substrate 113 to the first substrate 111. The sealing unit 114 may be disposed in the non-display area NDA of the display panel 110 to encapsulate the display unit 112. The sealing unit 114 may include inorganic material such as frit or organic material.

The pad portion 130 may be disposed on a front surface of the display panel 110 in the non-display area NDA. For example, the pad portion 130 may be located on a front surface of the first substrate 111. The pad portion 130 may be located adjacent to the side of the recessed portion 120. In an exemplary embodiment, the pad portion 130 may be located adjacent to the first side 121 of the recessed portion 120.

The pad portion 130 may include a plurality of pads PD. The pads PD may be arranged along the second direction DR2. The data voltage may be transmitted from the FPC 140 to each of the pads PD.

A distance D1 from the second side 110b of the display panel 110 to an end of the pad portion 130 adjacent to the first side 121 of the recessed portion 120 may be less than a distance D2 from the second side 110b of the display panel 110 to an end of the display area DA adjacent to the first side 110a of the display panel 110. In other words, the pad portion 130 may be located inside the display panel 110 rather than the end of the display area DA adjacent to the first side 110a of the display panel 110.

A width W1 of the pad portion 130 may be less than a width W2 of the recessed portion 120. For example, the width W2 of the recessed portion 120 may correspond to a distance between the second side 122 and the third side 123 of the recessed portion 120. Accordingly, the pad portion 130 may not be adjacent to the second side 122 or the third side 123 of the recessed portion 120.

The pads PD may be connected to the data lines DW through a plurality of fan-out lines FW. The fan-out lines FW may be disposed in the non-display area NDA. The fan-out lines FW may connect the pads PD and data lines DW, and may transmit the data voltage from the pads PD to the data lines DW. First set of the fan-out lines FW connected to the pads PD located at a center of the pad portion 130 may be extended to the first direction DR1 from the pad portion 130, and second set of the fan-out lines FW connected to the pads PD located on the second direction DR2 of the pad portion 130 may be extended to the second direction DR2 from the pad portion 130. Further, third set of the fan-out lines FW connected to the pads PD located on a third direction DR3 opposite to the second direction DR2 of the pad portion 130 may be extended to the third direction DR3 from the pad portion 130.

The FPC 140 connected to the pad portion 130 may be disposed on a front surface of the pad portion 130. The FPC 140 may electrically connect the pad portion 130 and the PCB 150. The FPC 140 may transmit the data voltage from the PCB 150 to the pad portion 130. The FPC 140 may be a display FPC for displaying an image of the display panel 110.

The FPC 140 may be bent to a rear surface of the display panel 110 around the side of the recessed portion 120. In other words, a first end of the FPC 140 may be located on the front surface of the display panel 110, and a second end of the FPC 140 may be located on the rear surface of the display panel 110. In an exemplary embodiment, the FPC 140 may be bent along a bending axis BX inside the FPC 140 with being bent around the first side 121 of the recessed portion 120. Here, the bending axis BX of the FPC 140 may be located inside the recessed portion 120.

A distance D3 from the second side 110b of the display panel 110 to the bending axis BX of the FPC 140 may be less than a distance D4 from the second side 110b of the display panel 110 to the first side 110a of the display panel 110. In other words, the bending axis BX of the FPC 140 may be located inside the display panel 110 rather than the first side 110a of the display panel 110.

The distance D3 from the second side 110b of the display panel 110 to the bending axis BX of the FPC 140 may be greater than a distance D5 from the second side 110b of the display panel 110 to the first side 121 of the recessed portion 120. In other words, the bending axis BX of the FPC 140 may be located inside the recessed portion 120, and the FPC 140 may partially overlap the recessed portion 120 in a plan view.

A width W3 of the FPC 140 may be less than the width W2 of the recessed portion 120. Accordingly, the FPC 140 may not be adjacent to the second side 122 or the third side 123 of the recessed portion 120.

In a display device according to the conventional technology, a pad portion may be located in a non-display area adjacent to a lower side of a display panel, and a FPC may be bent around the lower side of the display panel. Therefore, a dead space of the display device may increase by a length of the FPC in a plan view. However, in the display device according to the exemplary embodiment, the pad portion 130 may be located in the non-display area NDA adjacent to the upper side 110a of the display panel 110 at which the recessed portion 120 is formed, and the FPC 140 may be bent around the side of the recessed portion 120 of the display panel 110. Therefore, a dead space of the display device may decrease.

The PCB 150 connected to the FPC 140 may be located on the rear surface of the display panel 110. For example, the PCB 150 may be disposed on a rear surface of the first substrate 111. The PCB 150 may be electrically connected to the display panel 110 through the FPC 140.

Hereinafter, a display device according to an exemplary embodiment will be described with reference to FIGS. 5 and 6.

Figure 5:
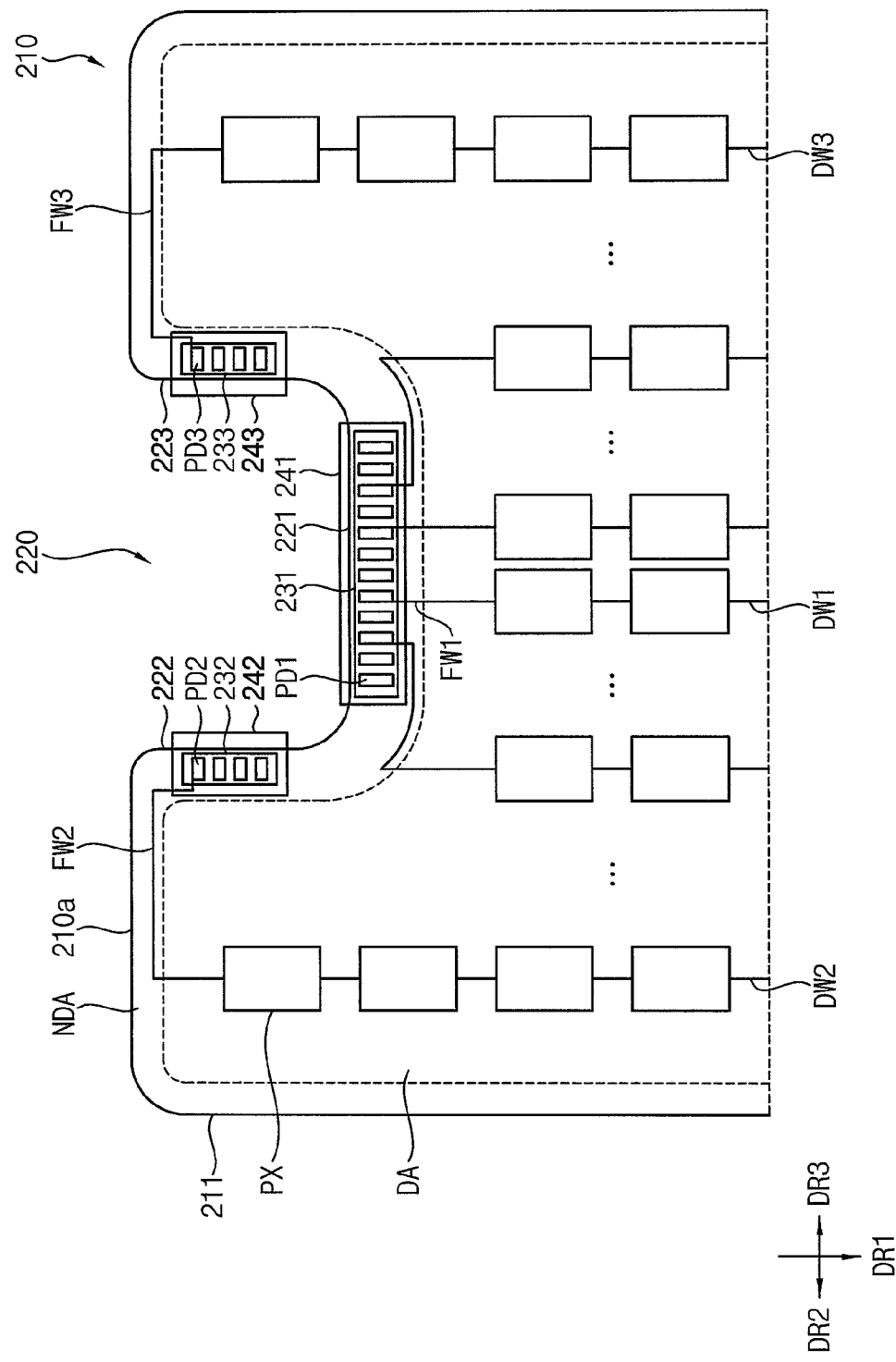
FIG. 5 is a front view illustrating a display device according to an exemplary embodiment.

FIG. 5 is a front view illustrating a display device according to an exemplary embodiment. FIG. 6 is a rear view illustrating the display device in FIG. 5.

Figure 6:
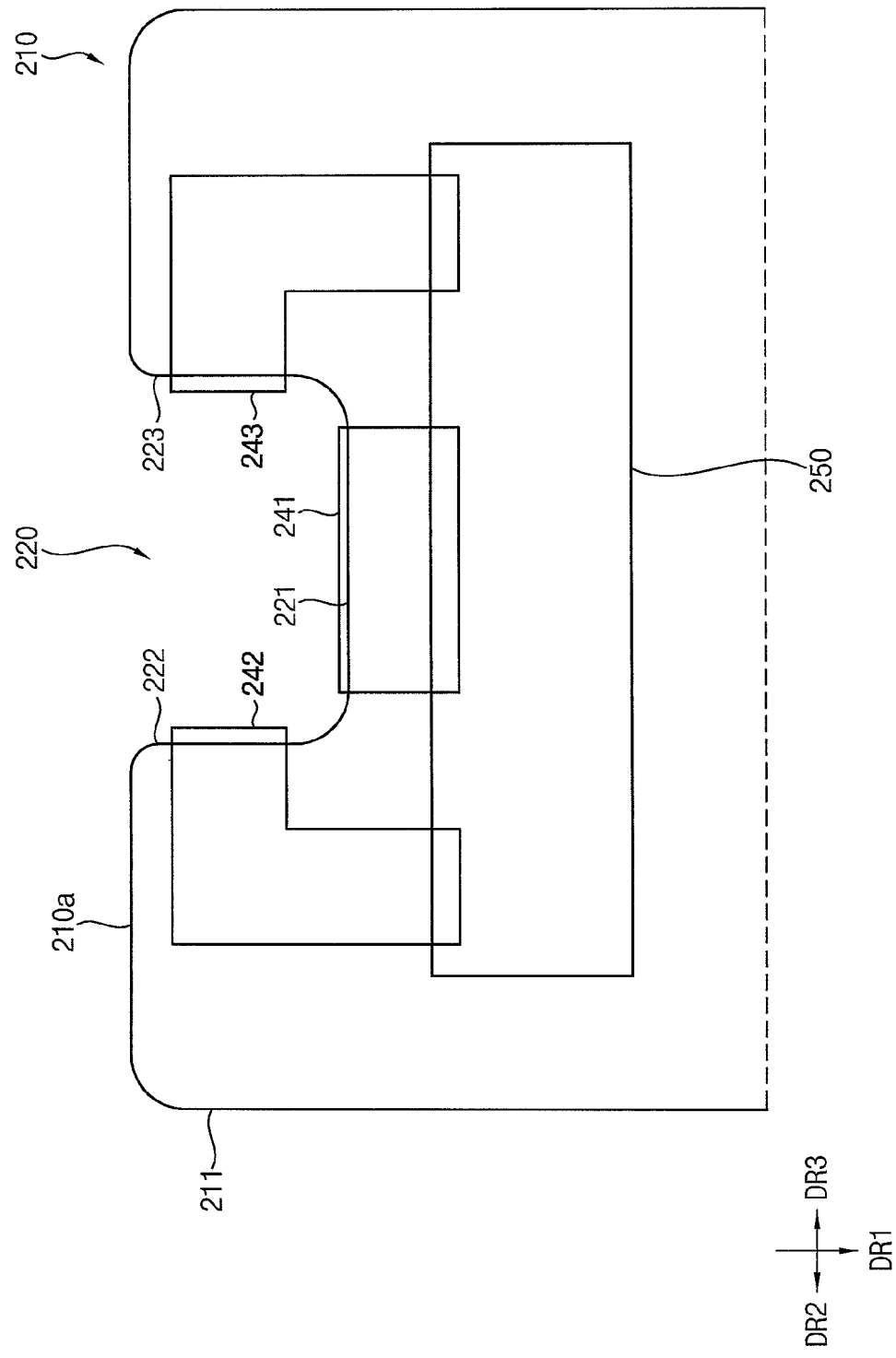
FIG. 6 is a rear view illustrating the display device in FIG. 5.

Referring to FIGS. 5 and 6, a display device according to an exemplary embodiment may include a display panel 210, a first pad portion 231, a second pad portion 232, a third pad portion 233, a first flexible printed circuit (FPC) 241, a second FPC 242, a third FPC 243, and a printed circuit board (PCB) 250. A recessed portion 220 may be formed at one side of the display panel 210. Detailed descriptions on elements of the display device according to an exemplary embodiment with reference to FIGS. 5 and 6, which are substantially the same as or similar to those of the display device according to the exemplary embodiment with reference to FIGS. 1, 2, 3, and 4, will not be repeated.

A plurality of data lines DW1, DW2, and DW3 may be disposed in the display area DA. The data lines DW1, DW2, and DW3 may include first data lines DW1 located on the first direction DR1 from the recessed portion 220 in the display area DA, second data lines DW2 located on the second direction DR2 from the recessed portion 220 in the display area DA, and third data lines DW3 located on the third direction DR3 from the recessed portion 220 in the display area DA. The data lines DW1, DW2, and DW3 may extend along the first direction DR1, and may be spaced apart from each other in the second direction DR2. The data lines DW1, DW2, and DW3 may supply data voltage for emitting light to the plurality of pixels PX.

The first pad portion 231, the second pad portion 232, and the third pad portion 233 may be disposed on a front surface of the display panel 210 in the non-display area NDA. For example, the first pad portion 231, the second pad portion 232, and the third pad portion 233 may be located on a front surface of the first substrate 211. The first pad portion 231, the second pad portion 232, and the third pad portion 233 may be located adjacent to the side of the recessed portion 220. In an exemplary embodiment, the first pad portion 231, the second pad portion 232, and the third pad portion 233 may be located adjacent to the first side 221, the second side 222, and the third side 223 of the recessed portion 220, respectively. For example, the first pad portion 231 of the display device in FIG. 5 may be substantially the same as the pad portion 130 of the display device in FIG. 2.

The first pad portion 231 may include a plurality of first pads PD1, the second pad portion 232 may include a plurality of second pads PD2, and the third pad portion 233 may include a plurality of third pads PD3. The first pads PD1 may be arranged along the second direction DR2, and the second pads PD2 and the third pads PD3 may be arranged along the first direction DR1. The data voltage may be transmitted from the first FPC 241 to each of the first pads PD1, the data voltage may be transmitted from the second FPC 242 to each of the second pads PD2, and the data voltage may be transmitted from the third FPC 243 to each of the third pads PD3.

The first pads PD1 may be connected to the first data lines DW1 through a plurality of first fan-out lines FW1, and the first fan-out lines FW1 may be disposed in the non-display area NDA. The first fan-out lines FW1 may connect the first pads PD1 and the first data lines DW1, and may transmit the data voltage from the first pads PD1 to the first data lines DW1. First set of the first fan-out lines FW1 connected to the first pads PD1 located at a center of the first pad portion 231 may be extended to the first direction DR1 from the first pad portion 231, and second set of the first fan-out lines FW1 connected to the first pads PD1 located on the second direction DR2 or the third direction DR3 of the first pad portion 231 may be extended to the second direction DR2 or the third direction DR3 from the first pad portion 231.

The second pads PD2 may be connected to the second data lines DW2 through a plurality of second fan-out lines FW2, and the third pads PD3 may be connected to the third data lines DW3 through a plurality of third fan-out lines FW3. The second and third fan-out lines FW2 and FW3 may be disposed in the non-display area NDA. The second fan-out lines FW2 may connect the second pads PD2 and the second data lines DW2, and may transmit the data voltage from the second pads PD2 to the second data lines DW2. Further, the third fan-out lines FW3 may connect the third pads PD3 and the third data lines DW3, and may transmit the data voltage from the third pads PD3 to the third data lines DW3. The second fan-out lines FW2 connected to the second pads PD2 may be extended to the second direction DR2 from the second pad portion 232, and the third fan-out lines FW3 connected to the third pads PD3 may be extended to the third direction DR3 from the third pad portion 233.

The first FPC 241 connected to the first pad portion 231 may be disposed on a front surface of the first pad portion 231. The first FPC 241 may electrically connect the first pad portion 231 and the PCB 250. The first FPC 241 may be bent to a rear surface of the display panel 210 around the side of the recessed portion 220. The first FPC 241 may be bent along a bending axis inside the first FPC 241 with being bent around the first side 221 of the recessed portion 220. For example, the first FPC 241 of the display device in FIG. 5 may be substantially the same as the FPC 140 of the display device in FIG. 2.

The second FPC 242 connected to the second pad portion 232 may be disposed on a front surface of the second pad portion 232, and the third FPC 243 connected to the third pad portion 233 may be disposed on a front surface of the third pad portion 233. The second FPC 242 may electrically connect the second pad portion 232 and the PCB 250, and the third FPC 243 may electrically connect the third pad portion 233 and the PCB 250. The second FPC 242 may transmit the data voltage from the PCB 250 to the second pad portion 232, and the third FPC 243 may transmit the data voltage from the PCB 250 to the third pad portion 233. The first FPC 241, the second FPC 242, and the third FPC 243 may be display FPCs for displaying an image of the display panel 210.

The second FPC 242 and the third FPC 243 may be bent to a rear surface of the display panel 210 around the side of the recessed portion 220. In other words, a first end of the second FPC 242 and a first end of the third FPC 243 may be located on the front surface of the display panel 210, and a second end of the second FPC 242 and a second end of the third FPC 243 may be located on the rear surface of the display panel 210. The second FPC 242 may be bent along a bending axis inside the second FPC 242 with being bent around the second side 222 of the recessed portion 220. The third FPC 243 may be bent along a bending axis inside the third FPC 243 with being bent around the third side 223 of the recessed portion 220.

When a width of the recessed portion 220 corresponding to a distance between the second side 222 and the third side 223 of the recessed portion 220 is relatively small, a space for arranging a sufficient number of the first pads PD1 in the first pad portion 231 located adjacent to the first side 221 of the recessed portion 220 may be insufficient. However, the display device according to the exemplary embodiment may include the second pad portion 232 and the third pad portion 233 located adjacent to the second side 222 and the third side 223 of the recessed portion 220, respectively, and the second FPC 242 and the third FPC 243 may be connected to the second pad portion 232 and the third pad portion 233, respectively. Therefore, a sufficient number of the pads PD1, PD2, and PD3 may be disposed in the pad portions 231, 232, and 233.

Hereinafter, a display device according to an exemplary embodiment will be described with reference to FIGS. 7, 8A, 8B, 9, 10A, and 10B.

Figure 7:
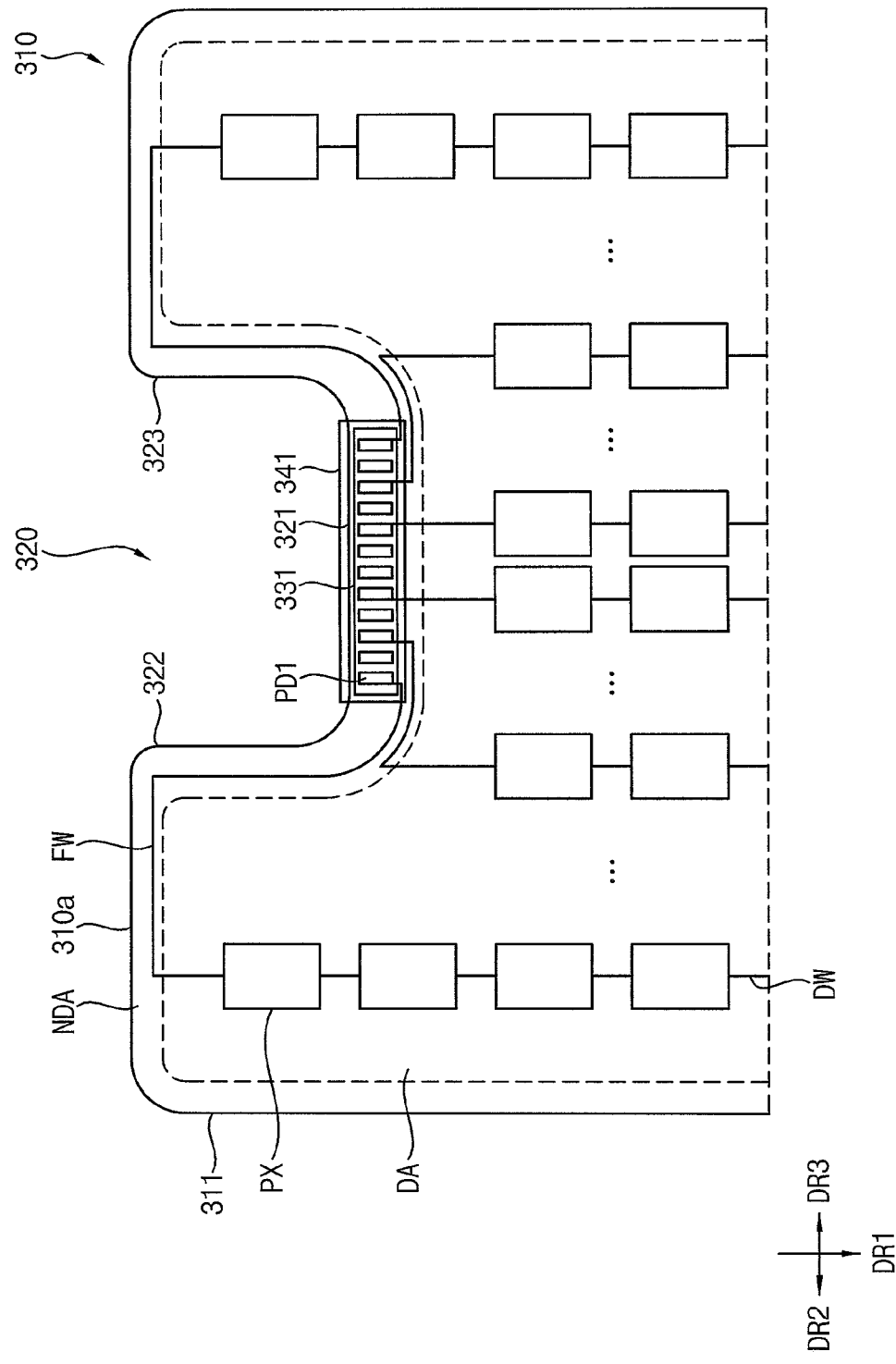
FIG. 7 is a front view illustrating a display device according to an exemplary embodiment.
Figure 8A:
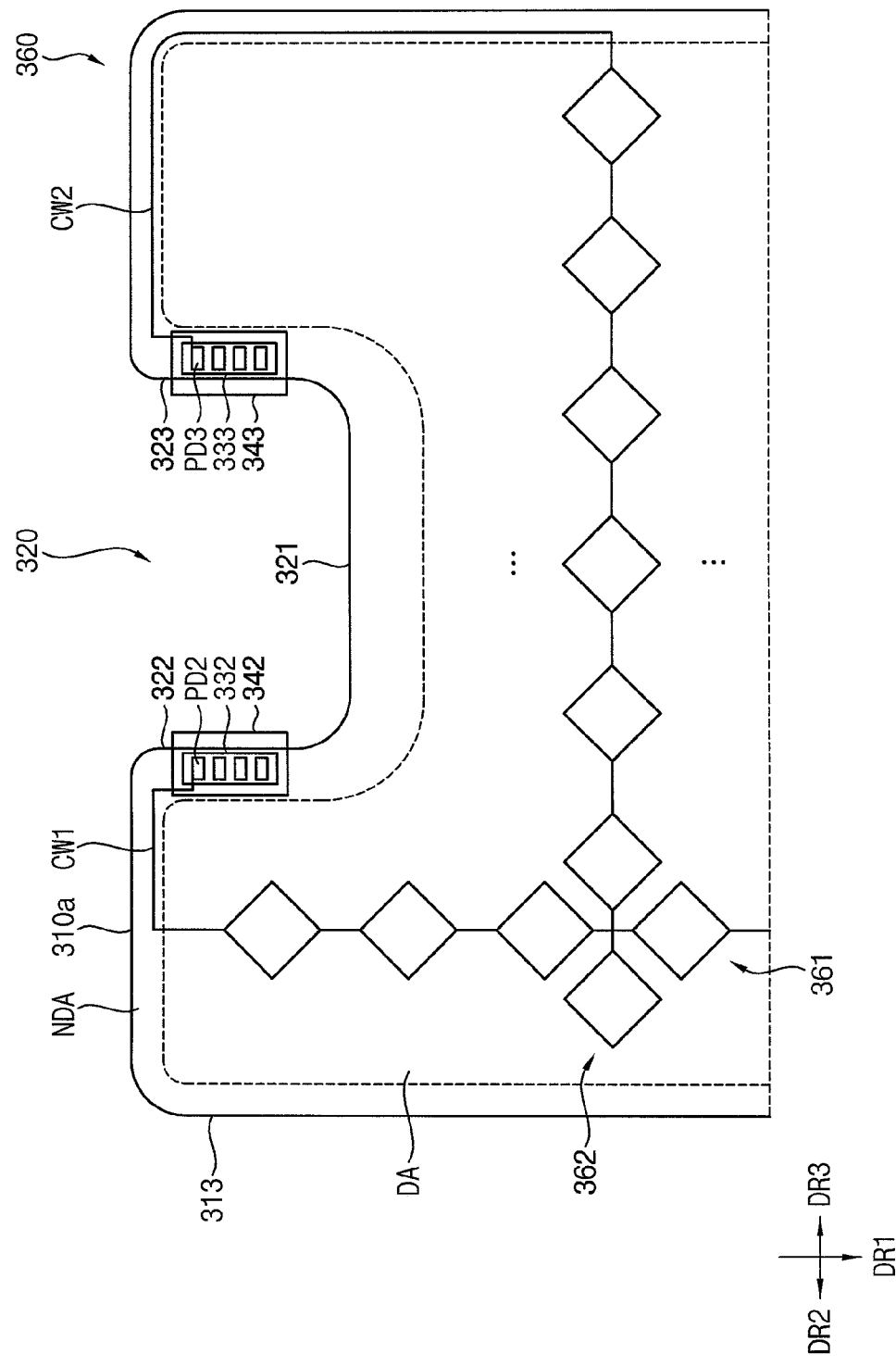
FIGS. 8A and 8B are front views illustrating a touch sensing unit of the display device in FIG. 7.
Figure 8B:
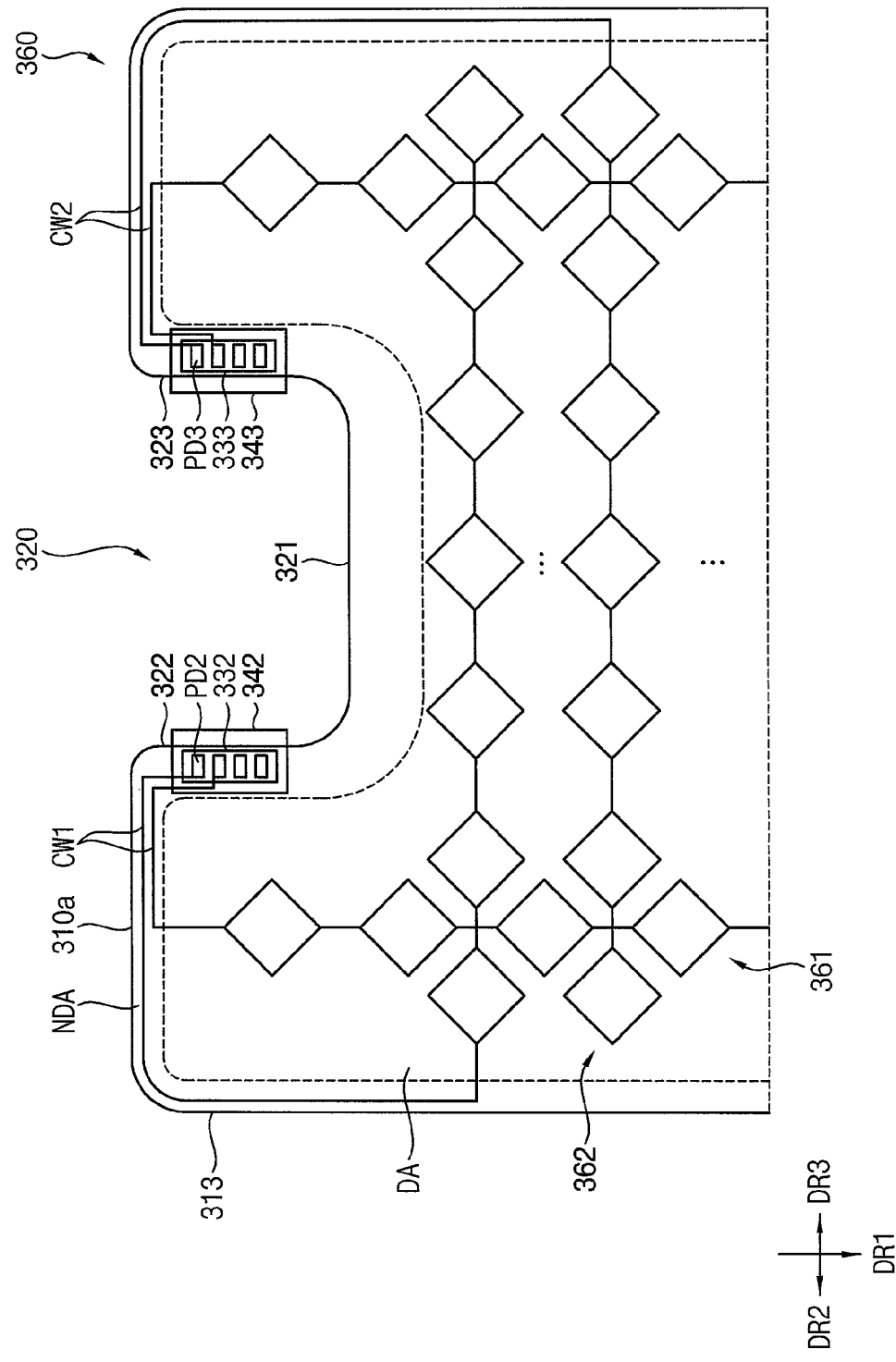
Figure 10B:
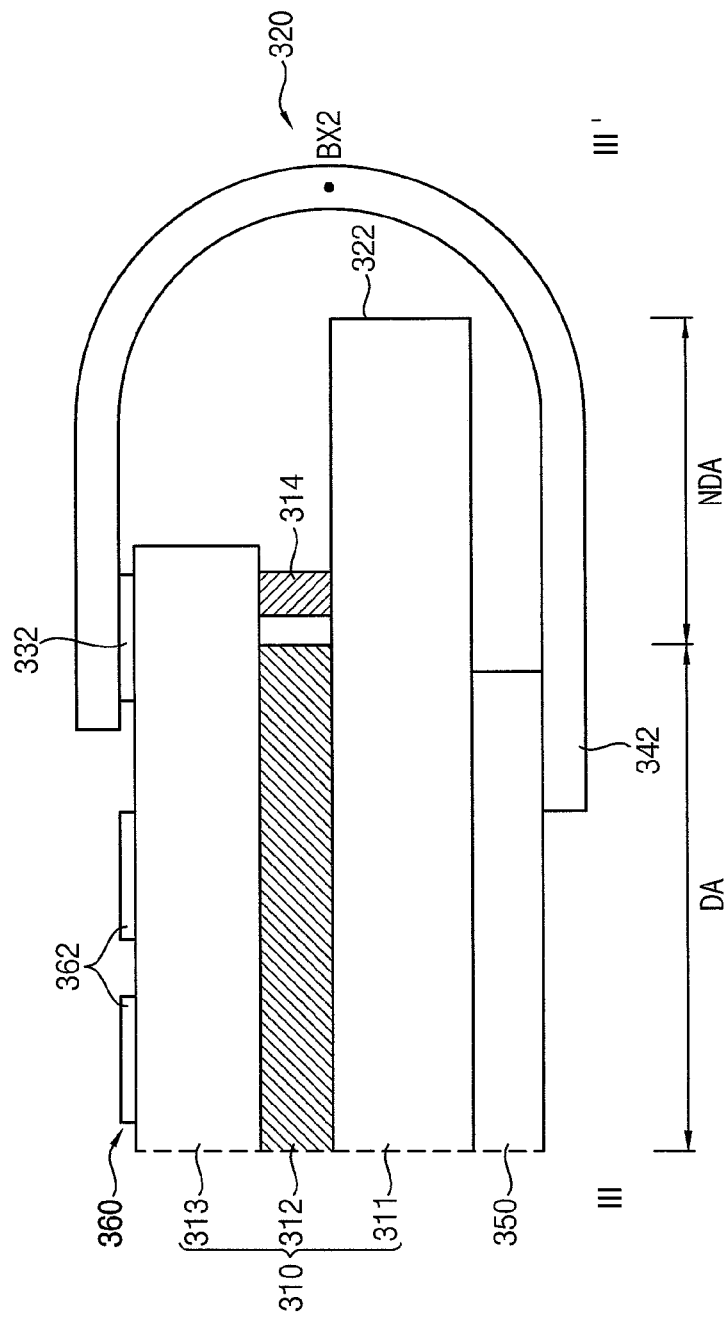
FIG. 10B is a cross-sectional view illustrating the display device in FIG. 9 taken along a sectional line III-III'.

FIG. 7 is a front view illustrating a display device according to an exemplary embodiment. FIGS. 8A and 8B are front views illustrating a touch sensing unit of the display device in FIG. 7. FIG. 9 is a rear view illustrating the display device in FIG. 7. FIG. 10A is a cross-sectional view illustrating the display device in FIG. 9 taken along a sectional line II-II', and FIG. 10B is a cross-sectional view illustrating the display device in FIG. 9 taken along a sectional line III-III'.

Referring to FIGS. 7, 8A, 8B, 9, 10A, and 10B, a display device according to an exemplary embodiment may include a display panel 310, a first pad portion 331, a second pad portion 332, a third pad portion 333, a first flexible printed circuit (FPC) 341, a second FPC 342, a third FPC 343, a printed circuit board (PCB) 350, and a touch sensing unit 360. A recessed portion 320 may be formed at one side of the display panel 310. Detailed descriptions on elements of the display device according to an exemplary embodiment with reference to FIGS. 7, 8A, 8B, 9, 10A, and 10B, which are substantially the same as or similar to those of the display device according to the exemplary embodiment with reference to FIGS. 1, 2, 3, and 4 and to those of the display device according to the exemplary embodiment with reference to FIGS. 5 and 6, will not be repeated.

The touch sensing unit 360 may be disposed on a front surface of the display panel 310. For example, the touch sensing unit 360 may be disposed on a front surface of the second substrate 313 of the display panel 310. The touch sensing unit 360 may detect a touch of a user. The touch sensing unit 360 may be a capacitive touch sensing unit. The touch sensing unit 360 may be connected to the second pad portion 332 and the third pad portion 333.

The touch sensing unit 360 may include a plurality of first sensing electrodes 361 and a plurality of second sensing electrodes 362. The first sensing electrodes 361 may extend along the first direction DR1, and may be spaced apart from each other in the second direction DR2. The second sensing electrodes 362 may extend along the second direction DR2, and may be spaced apart from each other in the first direction DR1. In an exemplary embodiment, the first sensing electrodes 361 may receive driving signals, and the second sensing electrodes 362 may output sensing signals. For example, when the sensing signals corresponding to changes of capacitances are outputted from the second sensing electrodes 362 during the driving signals are applied to the first sensing electrodes 361, the touch sensing unit 360 may determine a location on which a touch of the user is inputted.

The first pad portion 331, the second pad portion 332, and the third pad portion 333 may be disposed on a front surface of the display panel 310 in the non-display area NDA. For example, the first pad portion 331 may be located on a front surface of the first substrate 311, and the second pad portion 332 and the third pad portion 333 may be located on a front surface of the second substrate 313. The first pad portion 331, the second pad portion 332, and the third pad portion 333 may be located adjacent to the side of the recessed portion 320. In an exemplary embodiment, the first pad portion 331, the second pad portion 332, and the third pad portion 333 may be located adjacent to the first side 321, the second side 322, and the third side 323 of the recessed portion 320, respectively.

The first pad portion 331 may include a plurality of first pads PD1, the second pad portion 332 may include a plurality of second pads PD2, and the third pad portion 333 may include a plurality of third pads PD3. The data voltage may be transmitted from the first FPC 341 to each of the first pads PD1. The driving signals may be transmitted from the second FPC 342 to each of the second pads PD2, or each of the second pads PD2 may transmit the sensing signals to the second FPC 342. The driving signals may be transmitted from the third FPC 343 to each of the third pads PD3, or each of the third pads PD3 may transmit the sensing signals to the third FPC 343.

The second pads PD2 may be connected to a plurality of first connection lines CW1, and the third pads PD3 may be connected to a plurality of second connection lines CW2. The first and second connection lines CW1 and CW2 may be disposed on the front surface of the second substrate 313 in the non-display area NDA.

Referring to FIG. 8A, the first connection lines CW1 may be connected to the first sensing electrodes 361, and the second connection lines CW2 may be connected to the second sensing electrodes 362. The first connection lines CW1 may connect the second pads PD2 and the first sensing electrodes 361, and may transmit the driving signals from the second pads PD2 to the first sensing electrodes 361. Further, the second connection lines CW2 may connect the third pads PD3 and the second sensing electrodes 362, and may transmit the sensing signals from the second sensing electrodes 362 to the third pads PD3.

Referring to FIG. 8B, in another exemplary embodiment, the first connection lines CW1 may be connected to first set of the first sensing electrodes 361 and first set of the second sensing electrodes 362, and the second connection lines CW2 may be connected to second set of the first sensing electrodes 361 and second set of the second sensing electrodes 362. For example, first set of the first connection lines CW1 may connect first set of the second pads PD2 and the first sensing electrodes 361 located in the second direction DR2 from the recessed portion 320, and may transmit the driving signals from the first set of the second pads PD2 to the first sensing electrodes 361 located in the second direction DR2 from the recessed portion 320. Second set of the first connection lines CW1 may connect second set of the second pads PD2 and the first set of the second sensing electrodes 362, and may transmit the sensing signals from the first set of second sensing electrodes 362 to the second set of the second pads PD2.

Further, first set of the second connection lines CW2 may connect first set of the third pads PD3 and the first sensing electrodes 361 located in the third direction DR3 from the recessed portion 320, and may transmit the driving signals from the first set of the third pads PD3 to the first sensing electrodes 361 located in the third direction DR3 from the recessed portion 320. Second set of the second connection lines CW2 may connect second set of the third pads PD3 and the second set of the second sensing electrodes 362, and may transmit the sensing signals from the second set of second sensing electrodes 362 to the second set of the third pads PD3. For example, the first set of the second sensing electrodes 362 connected to the second set of the first connection lines CW1 and the second set of the second sensing electrodes 362 connected to the second set of the second connection lines CW2 may be alternately disposed along the first direction DR1.

The second FPC 342 connected to the second pad portion 332 may be disposed on a front surface of the second pad portion 332, and the third FPC 343 connected to the third pad portion 333 may be disposed on a front surface of the third pad portion 333. The second FPC 342 may electrically connect the second pad portion 332 and the PCB 350, and the third FPC 343 may electrically connect the third pad portion 333 and the PCB 350. The second FPC 342 may transmit the driving signals from the PCB 350 to the second pad portion 332, or may transmit the sensing signals from the second pad portion 332 to the PCB 350. The third FPC 343 may transmit the driving signals from the PCB 350 to the third pad portion 333, or may transmit the sensing signals from the third pad portion 333 to the PCB 350. The first FPC 341 may be a display FPC for displaying an image of the display panel 310, and the second FPC 342 and the third FPC 343 may be touch FPCs for sensing a touch of the touch sensing unit 360.

The second FPC 342 and the third FPC 343 may be bent to a rear surface of the display panel 310 around the side of the recessed portion 320. In other words, a first end of the second FPC 342 and a first end of the third FPC 343 may be located on the front surface of the display panel 310, and a second end of the second FPC 342 and a second end of the third FPC 343 may be located on the rear surface of the display panel 310. Specifically, the first end of the second FPC 342 and the first end of the third FPC 343 may be located on a front surface of the second substrate 313 of the display panel 310. The second FPC 342 may be bent along a bending axis BX2 inside the second FPC 342 with being bent around the second side 322 of the recessed portion 320.

The third FPC 343 may be bent along a bending axis inside the third FPC 343 with being bent around the third side 323 of the recessed portion 320.

Hereinafter, a display device according to an exemplary embodiment will be described with reference to FIGS. 11, 12, 13A, and 13B.

Figure 11:
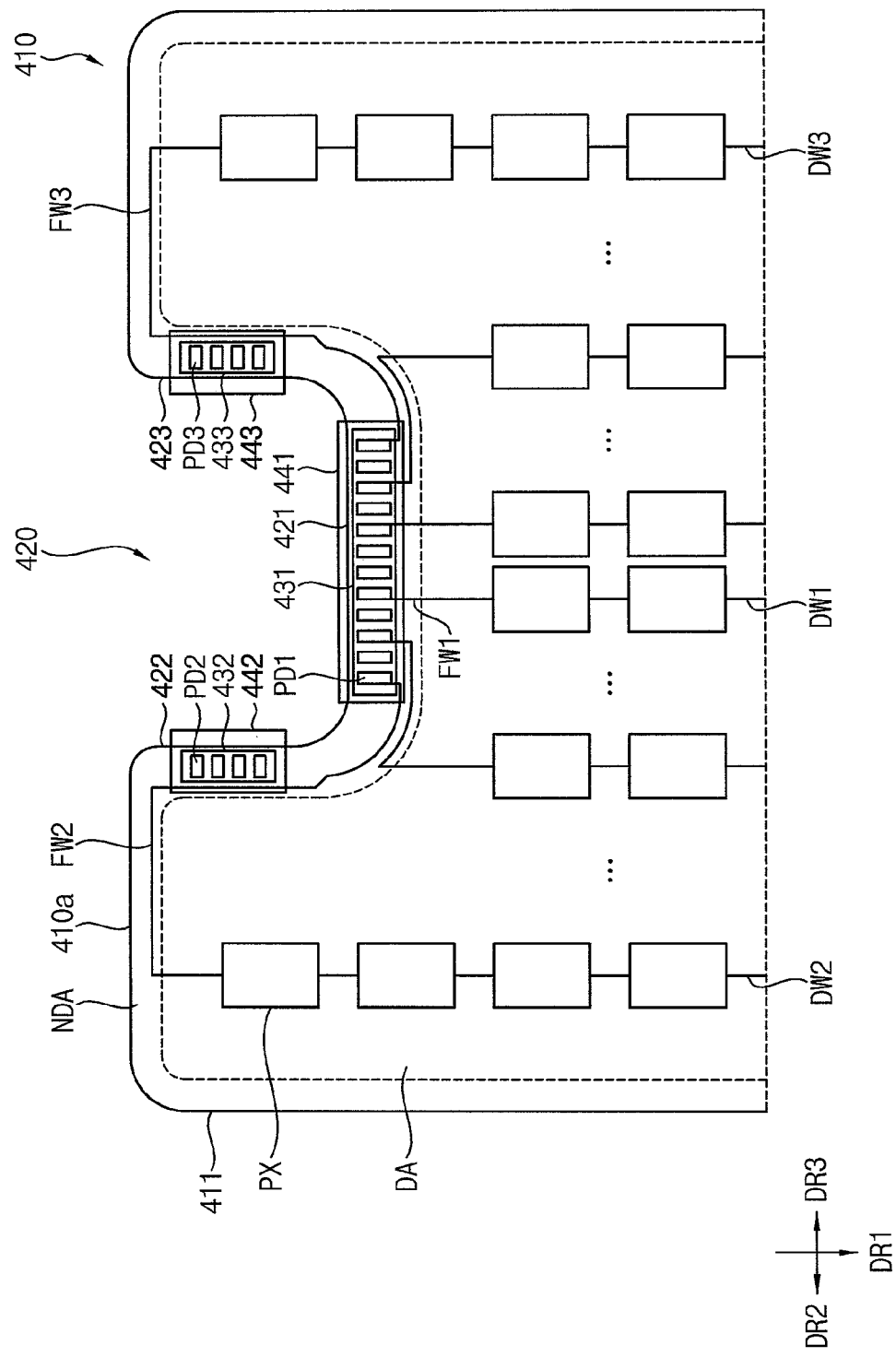
FIG. 11 is a front view illustrating a display device according to an exemplary embodiment.
Figure 12:
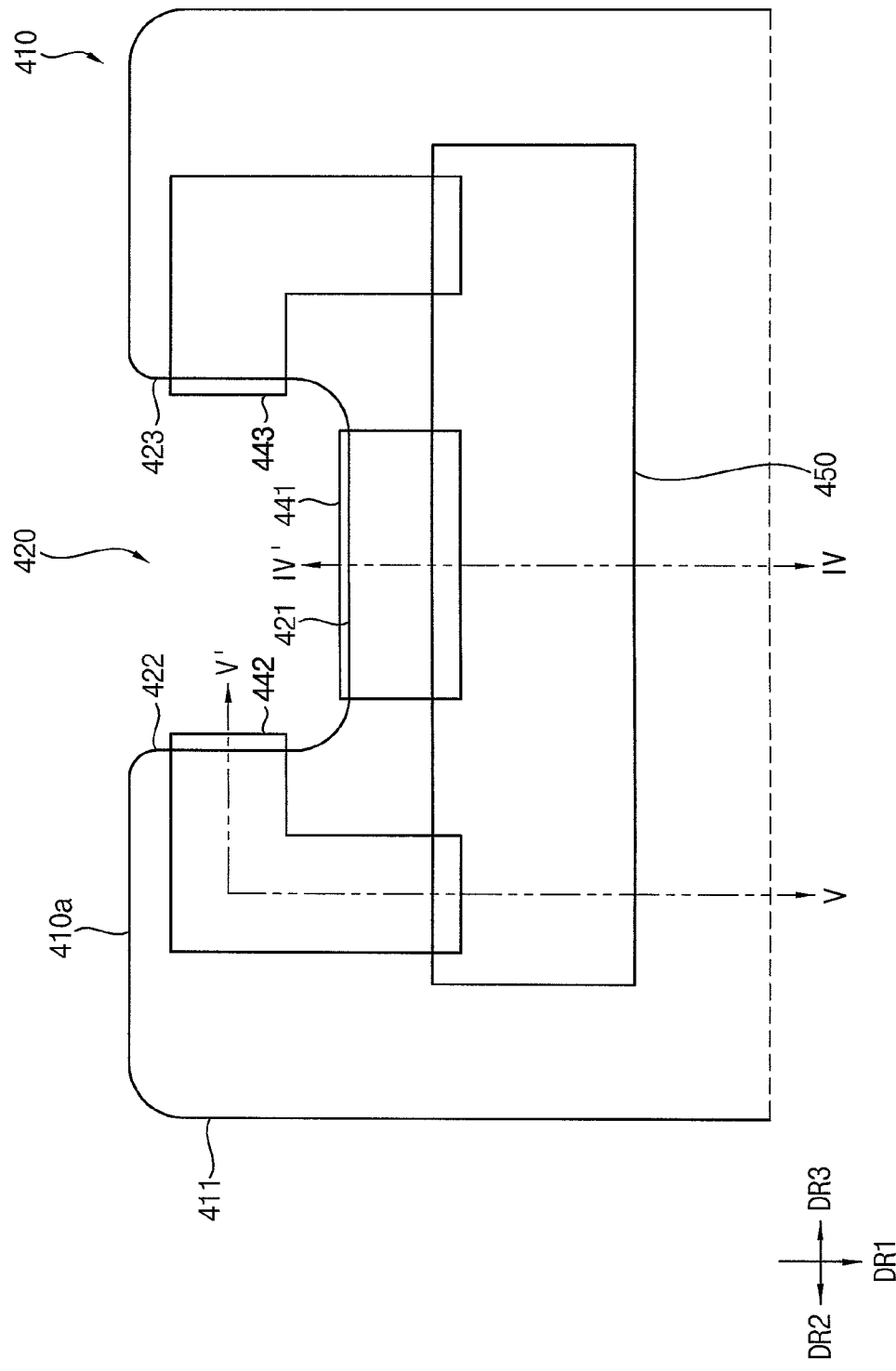
FIG. 12 is a rear view illustrating the display device in FIG. 11.
Figure 13A:
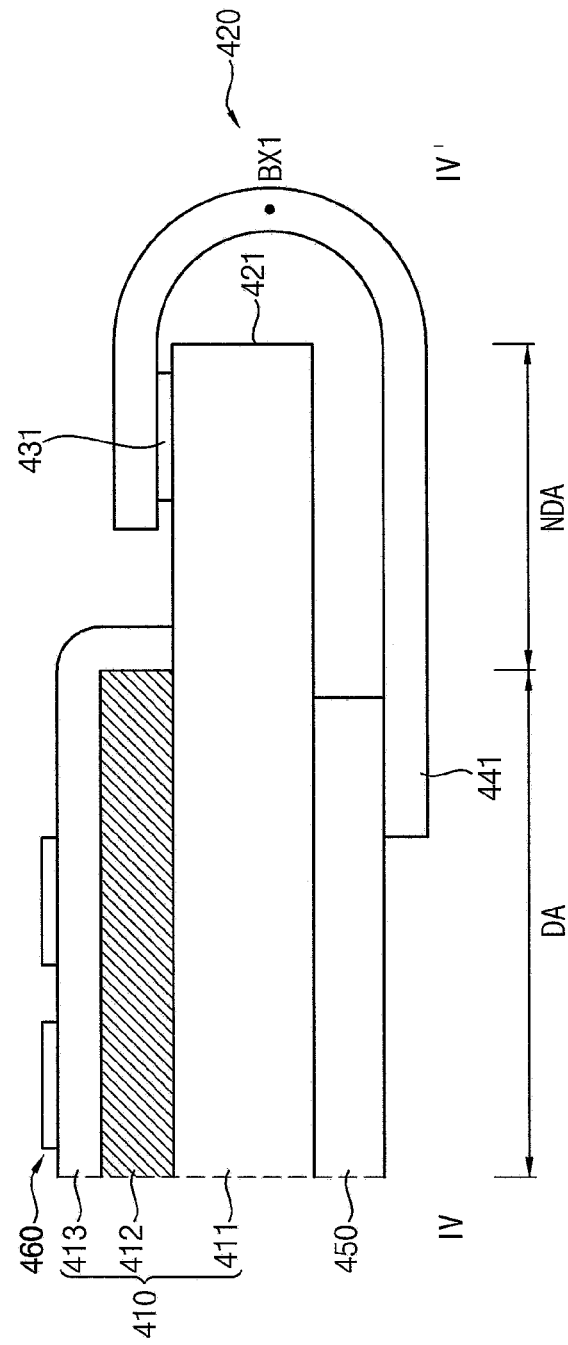
FIG. 13A is a cross-sectional view illustrating the display device in FIG. 12 taken along a sectional line IV-IV'.
Figure 13B:
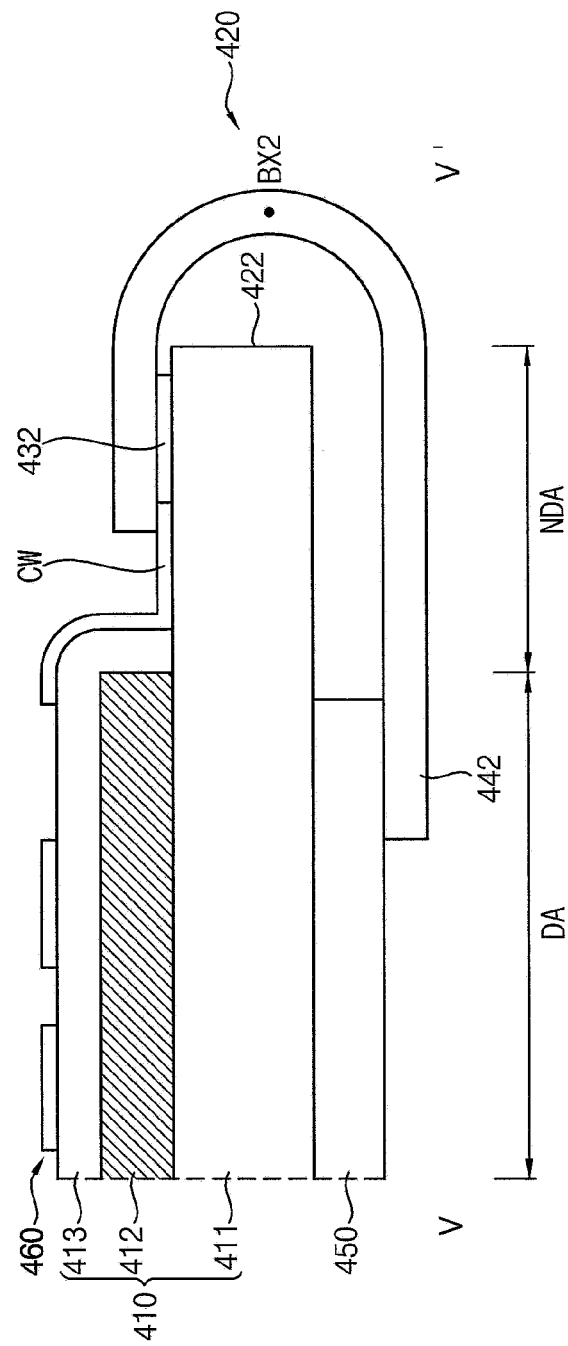
FIG. 13B is a cross-sectional view illustrating the display device in FIG. 12 taken along a sectional line V-V'.

FIG. 11 is a front view illustrating a display device according to an exemplary embodiment. FIG. 12 is a rear view illustrating the display device in FIG. 11. FIG. 13A is a cross-sectional view illustrating the display device in FIG. 12 taken along a sectional line IV-IV', and FIG. 13B is a cross-sectional view illustrating the display device in FIG. 12 taken along a sectional line V-V'.

Referring to FIGS. 11, 12, 13A, and 13B, a display device according to an exemplary embodiment may include a display panel 410, a first pad portion 431, a second pad portion 432, a third pad portion 433, a first flexible printed circuit (FPC) 441, a second FPC 442, a third FPC 443, a printed circuit board (PCB) 450, and a touch sensing unit 460. A recessed portion 420 may be formed at one side of the display panel 410. Detailed descriptions on elements of the display device according to an exemplary embodiment with reference to FIGS. 11, 12, 13A, and 13B, which are substantially the same as or similar to those of the display device according to the exemplary embodiment with reference to FIGS. 7, 8A, 8B, 9, 10A, and 10B, will not be repeated.

The display panel 410 may include a flexible substrate 411, a display unit 412, and an encapsulation layer 413. The flexible substrate 411 may include flexible material such as polyimide (PI), polyethylene naphthalate (PEN), polyethylene terephthalate (PET), polyarylate (PAR), polycarbonate (PC), polyetherimide (PEI), polyethersulfone (PS), etc. The display unit 412 may be disposed on the flexible substrate 411.

The encapsulation layer 413 may be disposed on the display unit 412. The encapsulation layer 413 may be located on the flexible substrate 411 with covering the display unit 412. For example, the encapsulation layer 413 may cover an upper portion and a side portion of the display unit 412. In an exemplary embodiment, the encapsulation layer 413 may include at least one inorganic layer and at least one organic layer which are alternately stacked.

The touch sensing unit 460 may be disposed on a front surface of the display panel 410. For example, the touch sensing unit 460 may be disposed on a front surface of the encapsulation layer 413 of the display panel 410.

The first pad portion 431, the second pad portion 432, and the third pad portion 433 may be disposed on the front surface of the display panel 410 in the non-display area NDA. For example, the first pad portion 431, the second pad portion 432, and the third pad portion 433 may be located on a front surface of the flexible substrate 411. The first pad portion 431, the second pad portion 432, and the third pad portion 433 may be located adjacent to the side of the recessed portion 420. In an exemplary embodiment, the first pad portion 431, the second pad portion 432, and the third pad portion 433 may be located adjacent to the first side 421, the second side 422, and the third side 423 of the recessed portion 420, respectively.

The first pad portion 431 may include a plurality of first pads PD1, the second pad portion 432 may include a plurality of second pads PD2, and the third pad portion 433 may include a plurality of third pads PD3. The data voltage may be transmitted from the first FPC 441 to each of the first pads PD1. The driving signals may be transmitted from the second FPC 442 to each of the second pads PD2, or each of the second pads PD2 may transmit the sensing signals to the second FPC 442. The driving signals may be transmitted from the third FPC 443 to each of the third pads PD3, or each of the third pads PD3 may transmit the sensing signals to the third FPC 443.

The second pads PD2 and the third pads PD3 may be connected to a plurality of connection lines CW. The connection lines CW may be disposed on the front surface of the display panel 410 in the non-display area NDA. In an exemplary embodiment, the connection lines CW may extend from the front surface of the flexible substrate 411 to the front surface of the encapsulation layer 413 along a side of the encapsulation layer 413. Accordingly, the connection lines CW may connect the second pads PD2 and the third pads PD3 disposed on the front surface of the flexible substrate 411 to the touch sensing unit 460 disposed on the front surface of the encapsulation layer 413.

The second FPC 442 and the third FPC 443 may be bent to a rear surface of the display panel 410 around the side of the recessed portion 420. In other words, a first end of the second FPC 442 and a first end of the third FPC 443 may be located on the front surface of the display panel 410, and a second end of the second FPC 442 and a second end of the third FPC 443 may be located on the rear surface of the display panel 410. Specifically, the first end of the second FPC 442 and the first end of the third FPC 443 may be located on the front surface of the flexible substrate 411 of the display panel 410. The second FPC 442 may be bent along a bending axis BX2 inside the second FPC 442 with being bent around the second side 422 of the recessed portion 420. The third FPC 443 may be bent along a bending axis inside the third FPC 443 with being bent around the third side 423 of the recessed portion 420.

The display device according to the exemplary embodiments of may be applied to a display device included in a computer, a notebook, a mobile phone, a smartphone, a smart pad, a PMP, a PDA, an MP3 player, or the like.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel having a first side and a second side facing the first side in a first direction, the display panel comprising a recessed portion having a recessed shape from the first side of the display panel toward the second side in the first direction, the recessed portion comprising a first side parallel with the first side of the display panel, and a second side, and a third side connecting the first side of the recessed portion to the first side of the display panel and opposite to each other;
   a first pad portion on a front surface of the display panel, the first pad portion being adjacent to the first side of the recessed portion;
   a first flexible printed circuit (FPC) connected to the first pad portion, the first FPC being bent to a rear surface of the display panel around the first side of the recessed portion;
   a second pad portion on the front surface of the display panel, the second pad portion being adjacent to the second side of the recessed portion;
   a second FPC connected to the second pad portion, the second FPC being bent to the rear surface of the display panel around the second side of the recessed portion;
   a third pad portion on the front surface of the display panel, the third pad portion being adjacent to the third side of the recessed portion;
   a third FPC connected to the third pad portion, the third FPC being bent to the rear surface of the display panel around the third side of the recessed portion; and
   a printed circuit board (PCB) on the rear surface of the display panel, the PCB being connected to the first FPC, the second FPC, and the third FPC,
   wherein the first FPC, the second FPC, and the third FPC are physically separated from each other.

2. The display device of claim 1, wherein the display panel comprises: a non-display area adjacent to the first side of the display panel and the first, second, and third sides of the recessed portion; and a display area adjacent to the first side of the display panel and the first, second, and third sides of the recessed portion with the non-display area in between,
   wherein the display device further comprises a plurality of data lines disposed in the display area extended along the first direction, the plurality of data lines comprising:
   a first data line located at the first direction from the recessed portion in the display area;
   a second data line located at a second direction crossing the first direction from the recessed portion in the display area; and
   a third data line located at a third direction opposite to the second direction from the recessed portion in the display area.

3. The display device of claim 2, further comprising a plurality of fan-out lines disposed in the non-display area, the plurality of fan-out lines respectively connected to the plurality of data lines;
   wherein the plurality of fan-out lines comprises:
   a first fan-out line connecting the first pad portion to the first data line; and
   a second fan-out line connecting the second pad portion to the second data line, and a third fan-out line connecting the third pad portion to the third data line.

4. The display device of claim 1, further comprising:
   a touch sensing unit disposed on the front surface of the display panel, the touch sensing unit being connected to the second pad portion and the third pad portion.

5. The display device of claim 4, wherein the display panel comprises a flexible substrate, a display unit on the flexible substrate, and an encapsulation layer covering the display unit, and
   the touch sensing unit is disposed on a front surface of the encapsulation layer.

6. The display device of claim 5, wherein the first pad portion, the second pad portion, and the third pad portion are disposed on a front surface of the flexible substrate.

7. The display device of claim 4, wherein the touch sensing unit comprises a plurality of first sensing electrodes extended along the first direction and a plurality of second sensing electrodes extended along a second direction crossing the first direction,
   the second pad portion is connected to the plurality of first sensing electrodes, and
   the third pad portion is connected to the plurality of second sensing electrodes.

8. A display device comprising:
   a display panel having a first side and a second side facing the first side in a first direction, the display panel comprising a recessed portion having a recessed shape from the first side of the display panel toward the second side in the first direction, the recessed portion comprising a first side parallel with the first side of the display panel, and a second side, and a third side connecting the first side of the recessed portion to the first side of the display panel and opposite to each other;

a first pad portion on a front surface of the display panel, the first pad portion being adjacent to the first side of the recessed portion;

a first flexible printed circuit (FPC) connected to the first pad portion, the first FPC being bent to a rear surface of the display panel around the first side of the recessed portion;

a second pad portion on the front surface of the display panel, the second pad portion being adjacent to the second side of the recessed portion;

a second FPC connected to the second pad portion, the second FPC being bent to the rear surface of the display panel around the second side of the recessed portion;

a third pad portion on the front surface of the display panel, the third pad portion being adjacent to the third side of the recessed portion; and a third FPC connected to the third pad portion, the third FPC being bent to the rear surface of the display panel around the third side of the recessed portion; and a printed circuit board (PCB) on the rear surface of the display panel, the PCB being connected to the first FPC, the second FPC, and the third FPC, wherein the display panel comprises a first substrate, a display unit disposed on the first substrate, and a second substrate on the display unit, and the touch sensing unit is disposed on a front surface of the second substrate, and wherein the second substrate extends past an end of the display unit with respect to a cross-sectional view of the display device.

9. The display device of claim 8, wherein the first pad portion is disposed on a front surface of the first substrate, and the second pad portion and the third pad portion are disposed on the front surface of the second substrate.

* * * * *